US006804273B1

(12) United States Patent
Sacchetto

(10) Patent No.: US 6,804,273 B1
(45) Date of Patent: Oct. 12, 2004

(54) METHOD AND SYSTEM FOR COMPENSATING A FREQUENCY STABILIZED OPTICAL SOURCE

(75) Inventor: Paolo Sacchetto, Sunnyvale, CA (US)

(73) Assignee: Ciena Corporation, Linthicum, MD (US)

( * ) Notice: Subject to any disclaimer, the term of this patent is extended or adjusted under 35 U.S.C. 154(b) by 7 days.

(21) Appl. No.: 10/100,845

(22) Filed: Mar. 19, 2002

(51) Int. Cl.[7] .............................................. H01S 3/13
(52) U.S. Cl. ..................... 372/32; 372/20; 372/34; 372/29.011; 372/38.02; 372/38.07
(58) Field of Search ............................. 372/20, 29.011, 372/32, 34–36, 38.02, 38.07

(56) References Cited

U.S. PATENT DOCUMENTS

| | | | | |
|---|---|---|---|---|
| 5,373,515 A | * | 12/1994 | Wakabayashi et al. | 372/20 |
| 6,359,918 B1 | * | 3/2002 | Bielas | 372/38.01 |
| 6,560,253 B1 | * | 5/2003 | Munks et al. | 372/32 |
| 6,580,513 B2 | * | 6/2003 | Akahoshi | 356/484 |

OTHER PUBLICATIONS

"Optical Components for Existing and Next–generation Networks," NEC Electronics (Europe) GmbH, Global Optical Communications, Jul. 2001, pp. 1–4.

"Tunable LD Module with Wavelength Locker", Fijitsu Compound Semiconductor, Inc., Global Optical Communications, Edition 1.0; Feb 2001, pp. 1–4.

"Wavelength Monitor Integrated 1550nm DFB laser Module", Fitel Technologies, Inc., Preliminary Data Sheet, Jun. 2001, pp. 1–5.

* cited by examiner

*Primary Examiner*—David Porta
*Assistant Examiner*—Davienne Monbleau
(74) *Attorney, Agent, or Firm*—Michael Cammarata; David Soltz; David Fox

(57) ABSTRACT

A controller for use with an optical device having an optical source and a frequency reference element. The controller includes a frequency processing module coupled to the optical device. The frequency processing module generates an error signal indicative of a deviation between the output frequency of the optical source and a reference frequency corresponding to a reference point. A driver module communicates with the optical device and the frequency processing module. The driver module adjusts a parameter of the optical source in response to the error signal. An offset processing module is coupled to the frequency processing module. The offset processing module derives an offset signal based on an estimate of a temperature of the frequency reference element. The offset processing module provides the offset signal to the frequency processing module which updates the reference point in response to the offset.

24 Claims, 9 Drawing Sheets

METHOD AND SYSTEM FOR COMPENSATING A FREQUENCY STABILIZED OPTICAL SOURCE

BACKGROUND OF THE INVENTION

1. Field of Invention

The invention relates generally to optical sources and in particular to compensation of thermal characteristics of a frequency stabilized optical source.

2. Description of Related Art

Recently, the channel density of commercial Wavelength Division Multiplexing (WDM) systems has increased dramatically, resulting in narrower frequency spacing between channels. Narrow channel spacing, on the order 25 GHz or 12.5 GHz, is often very sensitive to crosstalk caused by frequency drifts in which a channel interferes with an adjacent channel. To address this frequency drift and facilitate wavelength locking, optical device suppliers have integrated wavelength monitors with the optical source.

FIG. 1A is a block diagram of an optical device 10 with a frequency controller 60 (also referred to as a locker). The optical device 10 includes an optical source 20 with an integrated frequency reference element 30. The optical source 20 may include, but is not limited to, a distributed feedback (DFB) laser, other lasers, and the like, as well as combinations including the foregoing. The frequency reference element 30 is a component that translates the frequency of the output of the optical source 20 to an amplitude. An exemplary frequency reference element 30 is a Fabry-Perot etalon filter.

Light emitted from the rear facet of the optical source 20 is transmitted via a beam splitter to a first detector 40 and a frequency reference element 30 and thereafter to a second detector 50. The first detector 40 and second detector 50 may include but not limited to photo detectors, photodiodes, phototransistors, and the like, as well as combinations including the foregoing. The first detector 40 produces a current indicative of the total optical output power denoted $I_{pf}$. The second detector 50 produces a current indicative of a wavelength dependent optical power denoted $I_\lambda$. The optical power, as measured by the first detector 40 and second detector 50, is transmitted as currents $I_{pf}$ and $I_\lambda$ respectively, to controller 60.

FIG. 1B is a side view depicting one arrangement of components in the optical device 10. As shown in FIG. 1B, the optical source 20 and the frequency reference element 30 may be positioned on the thermal electrical cooler ("TEC") 72. As described in further detail, the frequency reference element 30 experiences a temperature gradient due to a difference between the temperature of TEC 72 and the case 11 (or alternatively called a housing) of the optical device 10. This temperature gradient causes the output frequency of the optical source 20 to vary.

The optical output from frequency reference element 30 varies with wavelength so that the current $I_\lambda$ is indicative of the wavelength output by optical source 20. FIG. 2 depicts an exemplary discriminator curve when an etalon filter is used for frequency reference element 30. The discriminator curve illustrates that the ratio of $I_\lambda$ to $I_{pf}$ is indicative of the output frequency of the optical source 20. The frequency processing module 62 executed by controller 60 translates currents $I_{pf}$ and $I_\lambda$ into an error signal that is used by a temperature compensator 70. The temperature compensator 70 adjusts the temperature of the optical source 20 to control the output frequency of the optical source 20.

The temperature compensator 70 includes, but is not limited to, a thermoelectric cooler (TEC) 72, temperature sensor 74 and temperature driver module 64. The temperature driver module 64 is preferably, but not necessarily, integrated with controller 60 to control temperature of the optical source 20. The error signal is received by the temperature driver module 64 which adjusts the temperature of the optical source 20 to reduce the error signal.

As described above, the existing wavelength-locking scheme is primarily composed of a feedback loop where the ratio $(I_\lambda/I_{pf})$ is monitored. Referring to FIG. 3, the desired frequency is established with a particular reference point $(I_\lambda/I_{pf})_{REF}$ 102 on the discriminator curve corresponding to a selected magnitude of the ratio $(I_\lambda/I_{pf})$ and resulting in the desired frequency $f_{REF}$. The feedback functionality implemented in frequency processing module 62 and temperature driver module 64 then adjusts the optical source 20 parameters to ensure that the ratio $(I_\lambda/I_{pf})$ is maintained at the reference point, $(I_\lambda/I_{pf})_{REF}$ 102. The optical source parameter that is adjusted can be the drive current, the temperature, or both. In the implementation depicted in FIG. 1 a temperature driver module 64 adjusts the temperature of the optical source 20 to maintain the desired frequency $f_{REF}$.

FIG. 4B depicts conventional wavelength locker processing with which the operating frequency is detected at step 190. The operating frequency is compared to a reference frequency at step 192 and operating parameters of the optical source 20 are adjusted at step 194.

A drawback to the existing systems is that the characteristics of the frequency reference element 30 change with temperature. Since the frequency reference element 30 may be distanced from the optical source 20, monitoring the temperature through temperature sensor 74 may not accurately reflect the temperature of the frequency reference element 30. As noted above, the frequency reference element 30 may experience a temperature gradient due to a temperature differential between the TEC 72 and the case 11 (or housing) of optical device 10. Variations in the temperature of the frequency reference element 30 shifts the discriminator curve. Thus, locking the frequency based on the same reference point $(I_\lambda/I_{pf})_{REF}$ 104 on the shifted discriminator curve will shift the locked frequency value to $f_{SHIFT}$. As a result of this temperature dependence for the frequency reference element 30, the operational frequency of a frequency-locked optical source 20 drifts as the case temperature of the optical device 10 is changed. This drift is depicted in FIG. 4A. Such drift in the output frequency of the optical source 20 can result in deleterious effects such as crosstalk between channels.

Therefore, there is a need for a mechanism to reduce the temperature effects on the frequency of the optical device 10.

SUMMARY OF THE INVENTION

An embodiment of the invention is a controller for use with an optical device having an optical source and a frequency reference element. The controller includes a frequency processing module coupled to the optical device. The frequency processing module generates an error signal indicative of a deviation between the output frequency of the optical source and a reference frequency corresponding to a reference point. A driver module communicates with the optical device and the frequency processing module. The driver module adjusts a parameter of the optical source in response to the error signal. An offset processing module is coupled to the frequency processing module. The offset processing module derives an offset signal based on an estimate of a temperature of the frequency reference element. The offset processing module provides the offset signal to the frequency processing module which updates the reference point in response to the offset.

BRIEF DESCRIPTION OF THE DRAWINGS

Embodiments of the present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1A:
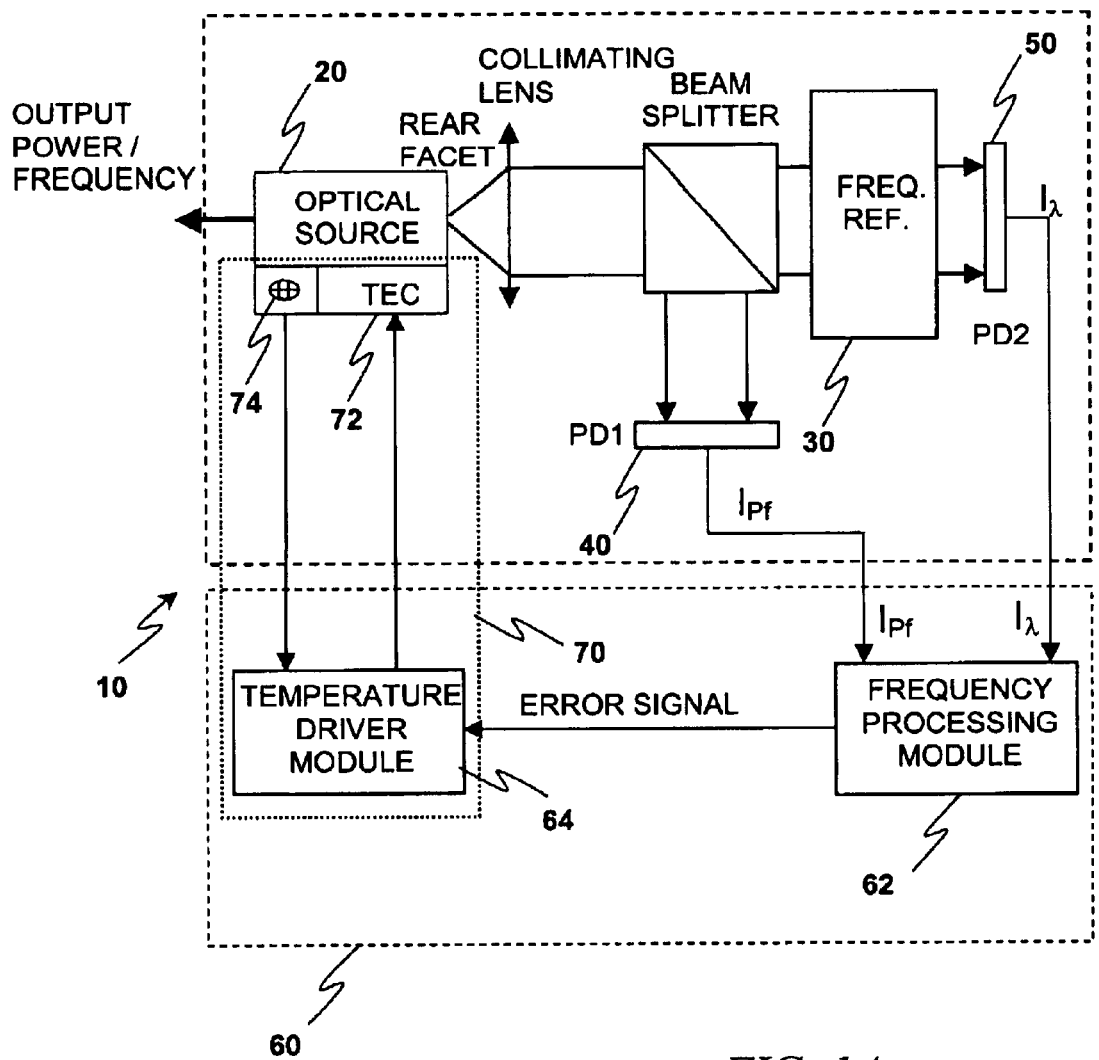
FIG. 1A is a block diagram of an existing optical device and controller.
Figure 1B:
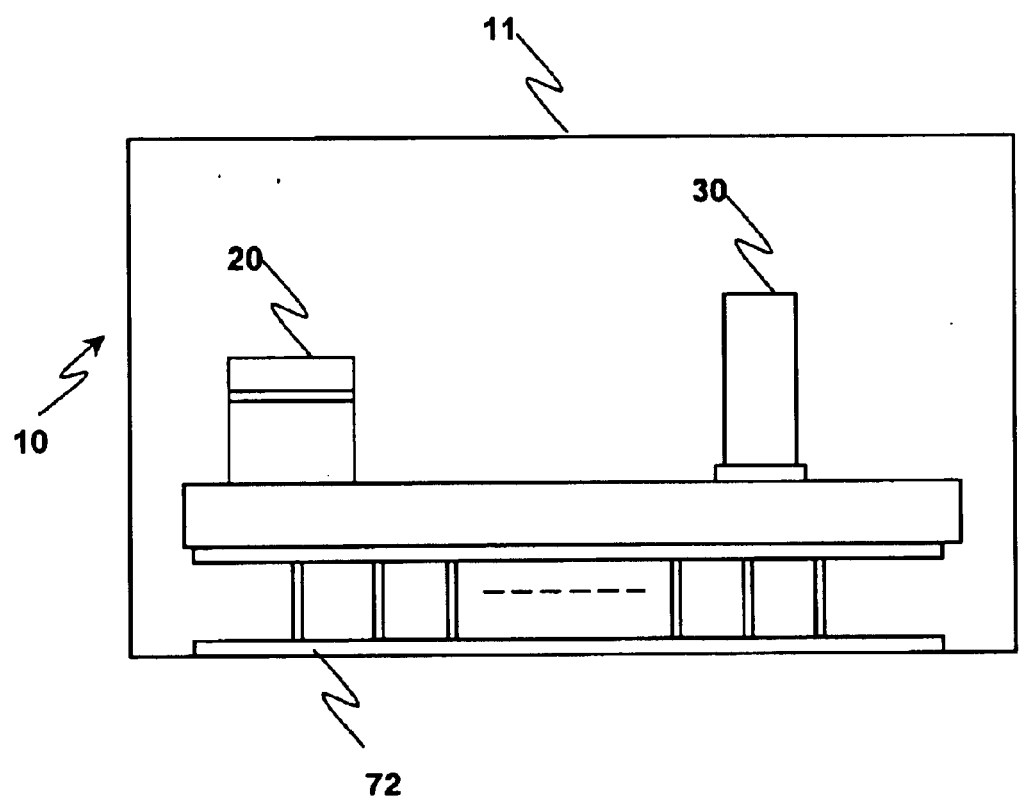
FIG. 1B is a block diagram illustrating exemplary placement of components in the optical device.
Figure 2:
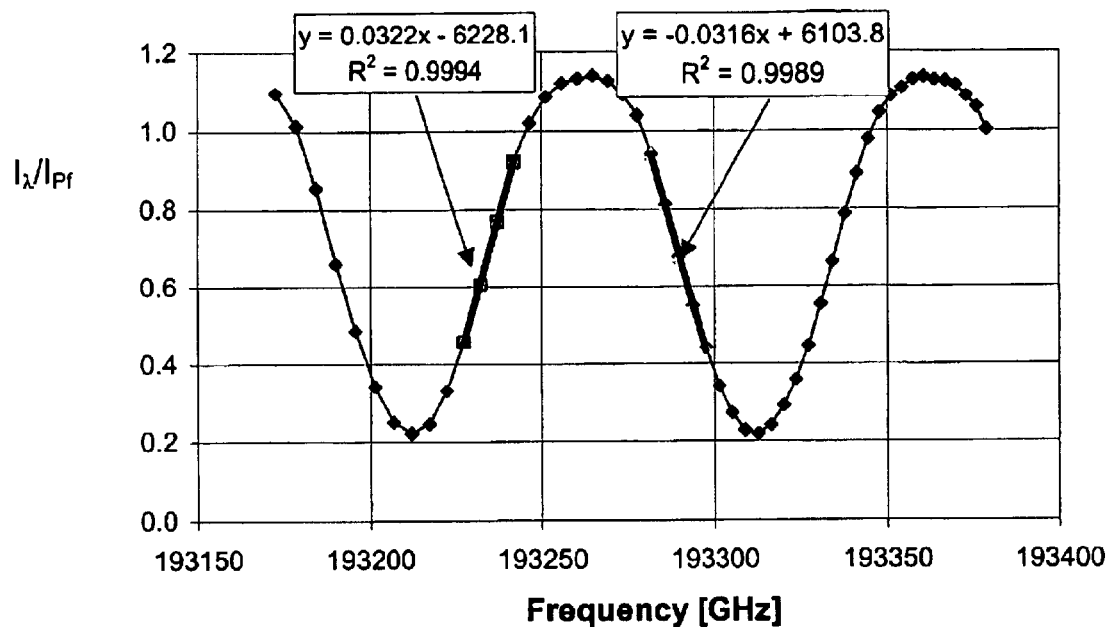
FIG. 2 depicts an exemplary discriminator curve for the frequency reference element in FIG. 1.
Figure 3:
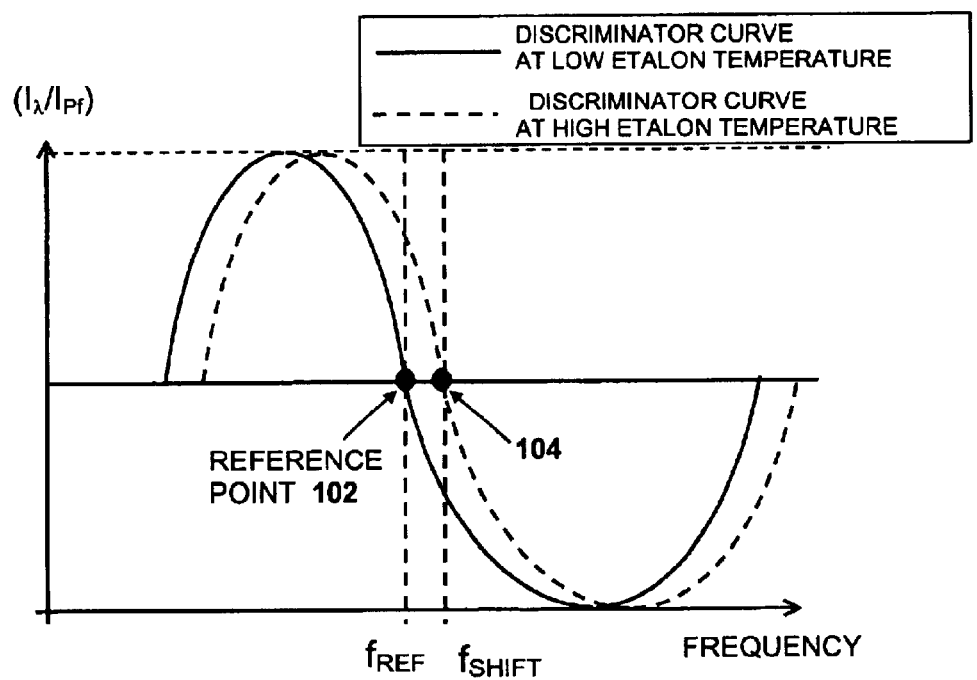
FIG. 3 depicts the temperature shift of the discriminator curve.
Figure 4A:
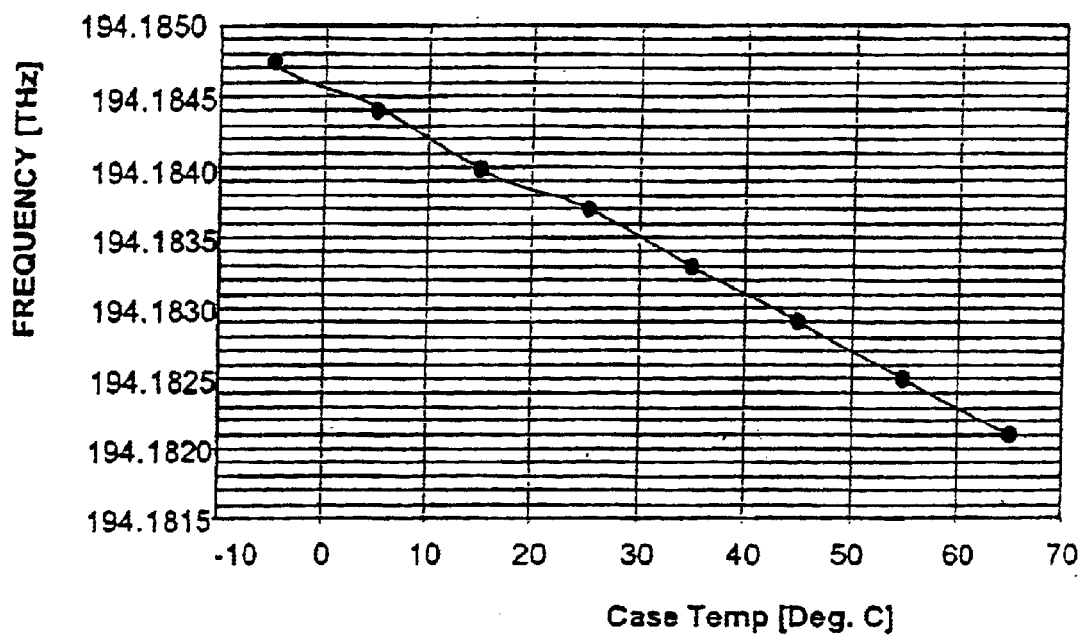
FIG. 4A depicts the temperature-induced drift in the output frequency of the optical device of FIG. 1.
Figure 4B:
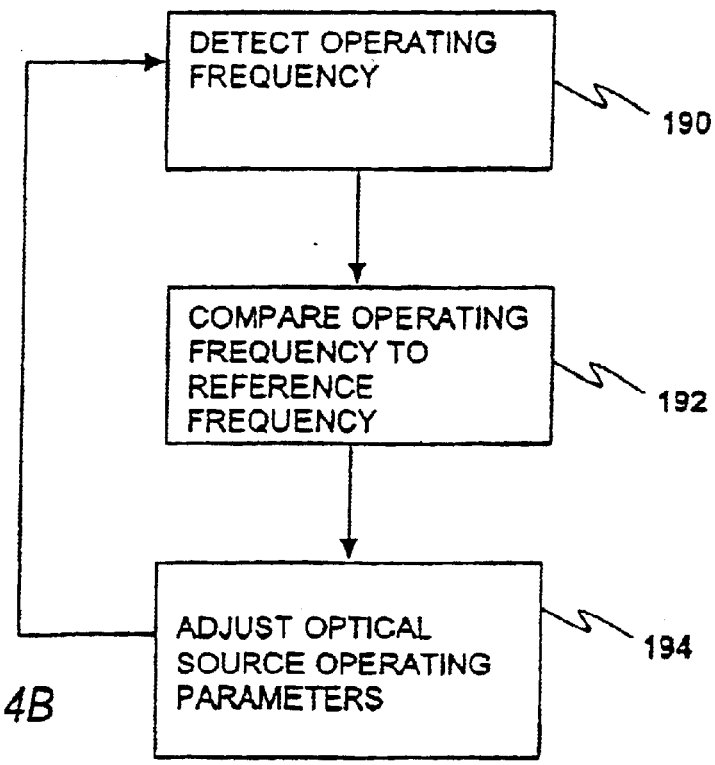
FIG. 4B is a flowchart of a conventional wavelength locking routine.
Figure 5:
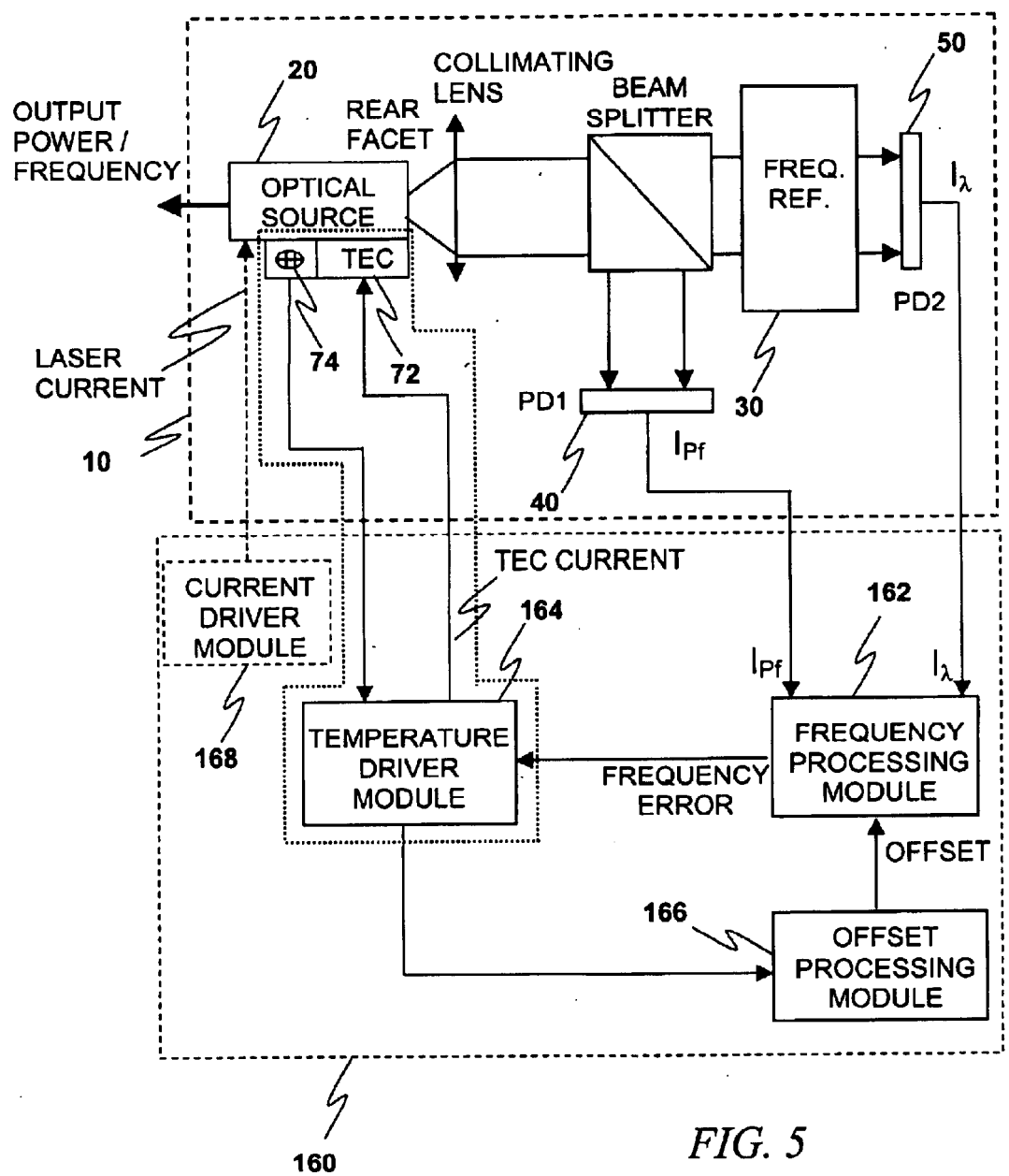
FIG. 5 depicts an optical device and a controller in an exemplary embodiment.

FIG. 5 is a block diagram of an optical device 10 and a controller 160. The optical device 10 is similar to existing optical devices such as that shown in FIG. 1. The controller 160 includes an offset processing module 166 that generates an offset to compensate for shifts in the discriminator curve discussed above with reference to FIG. 3. The controller 160 may be implemented using existing processor-based controllers. The frequency processing module 162, temperature driver module 164, offset driver module 166 and current driver module 168 are preferably executed by a processor in response to a program.

The frequency processing module 162 generates an error signal indicative of a divergence between a desired reference point and the measured ratio ($I_\lambda/I_{pf}$). As described in further detail herein, the reference point is adjusted by an offset provided by the offset processing module 166. The temperature driver module 164 adjusts the temperature of the optical source 20 to reduce the error. The temperature driver module 164 also provides a temperature parameter to the offset processing module 166 which is used to generate the offset. The current driver module 168 provides drive current to the optical source 20 but is not dynamically changed through a feedback loop.

The offset processing module 166 determines an estimate of the temperature of the frequency reference element 30 and then generates an offset to compensate for the temperature of the frequency reference element 30. The temperature of the frequency reference element 30 may be approximated as:

$$T_{freq.ref} \approx k_1 * T_{laser} + k_2 * T_{case} \quad (1)$$

Where: $T_{laser}$ is the temperature of the optical source 20;
$T_{case}$ is the case temperature of optical device 10; and
$k_1$ and $k_2$ are variables that can be approximated as constant values.

In general, $k_1$, and $k_2$ depend on factors such as the packaging design, device aging characteristics, $T_{case}$, and $T_{laser}$, of the optical device 10. Variables $k_1$ and $k_2$ may be readily measured and determined via a calibration procedure.

The temperature of the optical source 20 is relatively constant and thus, the temperature of the frequency reference element 30 may be represented as a function of the temperature of the case of optical device 10. The temperature of the frequency reference element 30 is not necessarily equal to the temperature of the optical source 20 due the temperature gradient across the frequency reference element 30. The invention is applicable regardless of whether the frequency reference element 30 is mounted on the TEC 72.

Figure 7:
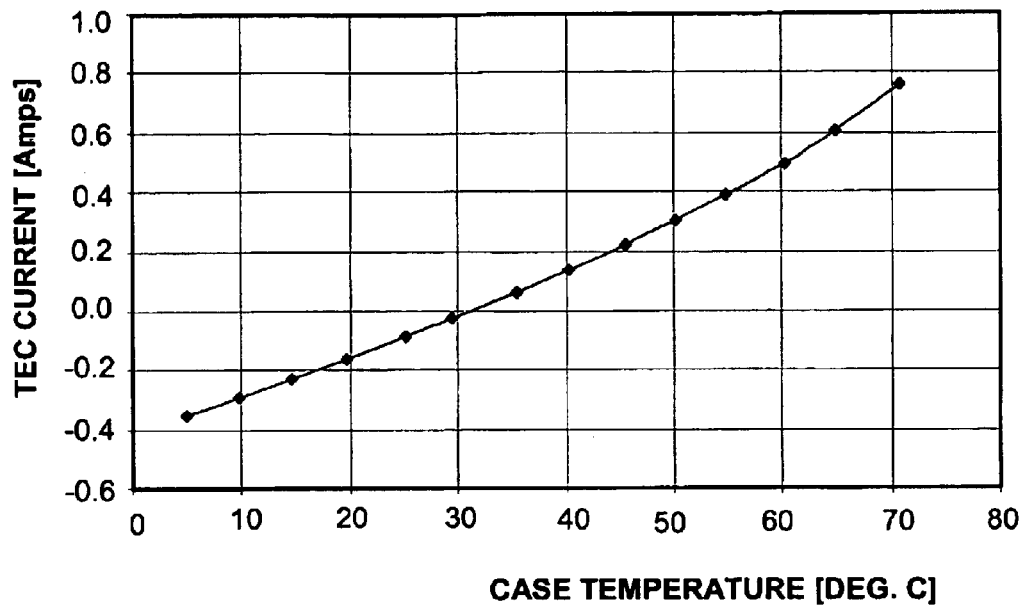
FIG. 7 depicts an illustrative graph of TEC current versus case temperature of the optical device of an exemplary embodiment.

One parameter related to the temperature of the case is the current provided to the TEC 72 by temperature driver module 164. FIG. 7 depicts an illustrative graph of TEC current versus case temperature. It is evident from the graph that the TEC current provides a readily determinable estimate of the case temperature for the optical device 10. An embodiment of the invention, therefore, can use this information to provide an offset to adjust the frequency of the optical device 10.

As stated earlier, the locking frequency is set at a particular reference point 102 on the discriminator curve corresponding to a selected magnitude of the ratio ($I_\lambda/I_{pf}$) and resulting in the desired frequency $f_{REF}$. Variations that affect the temperature of the frequency reference element 30 also shift the discriminator curve, and thereby, when using the same reference point value shown at 104, will in effect shift the locked frequency value, for example, to $f_{SHIFT}$.

The offset processing module 166 compensates for this shift in the discriminator curve. The temperature driver module 164 provides a measure of the TEC current to the offset processing module 166. As noted above, the TEC current provides an indication of the temperature of the frequency reference element 30 and thus, an estimate of the shift in the discriminator curve. The estimated temperature of the frequency reference element 30 is then utilized by an offset processing module 166 to derive an offset.

Figure 8:
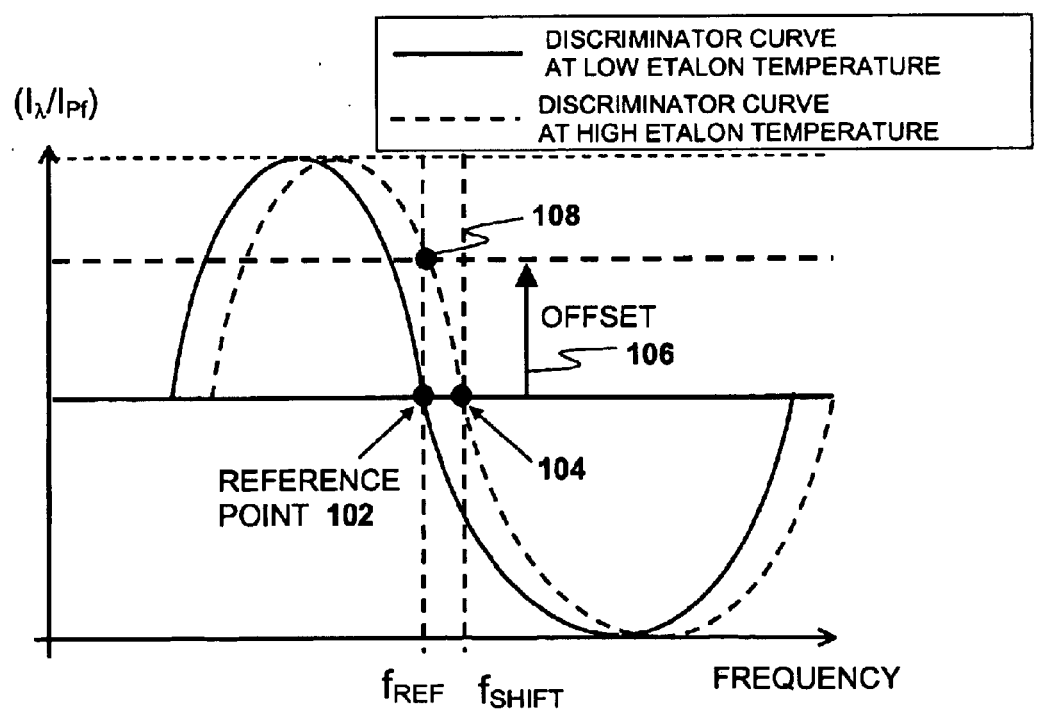
FIG. 8 illustrates the effect of applying a thermal compensation offset to the reference point to maintain a desired frequency.

The offset is provided to the frequency processing module 162 and the reference point is adjusted by the offset. This adjustment is depicted in FIG. 8 as an offset 106 being combined with the reference point 102 to derive a temperature compensated reference point 108, which results in frequency locking at the original desired frequency $f_{REF}$. If the reference point 102 is not adjusted by the offset 106, the reference point is shifted to 104 resulting in locking at the wrong frequency, $f_{SHIFT}$.

Figure 10:
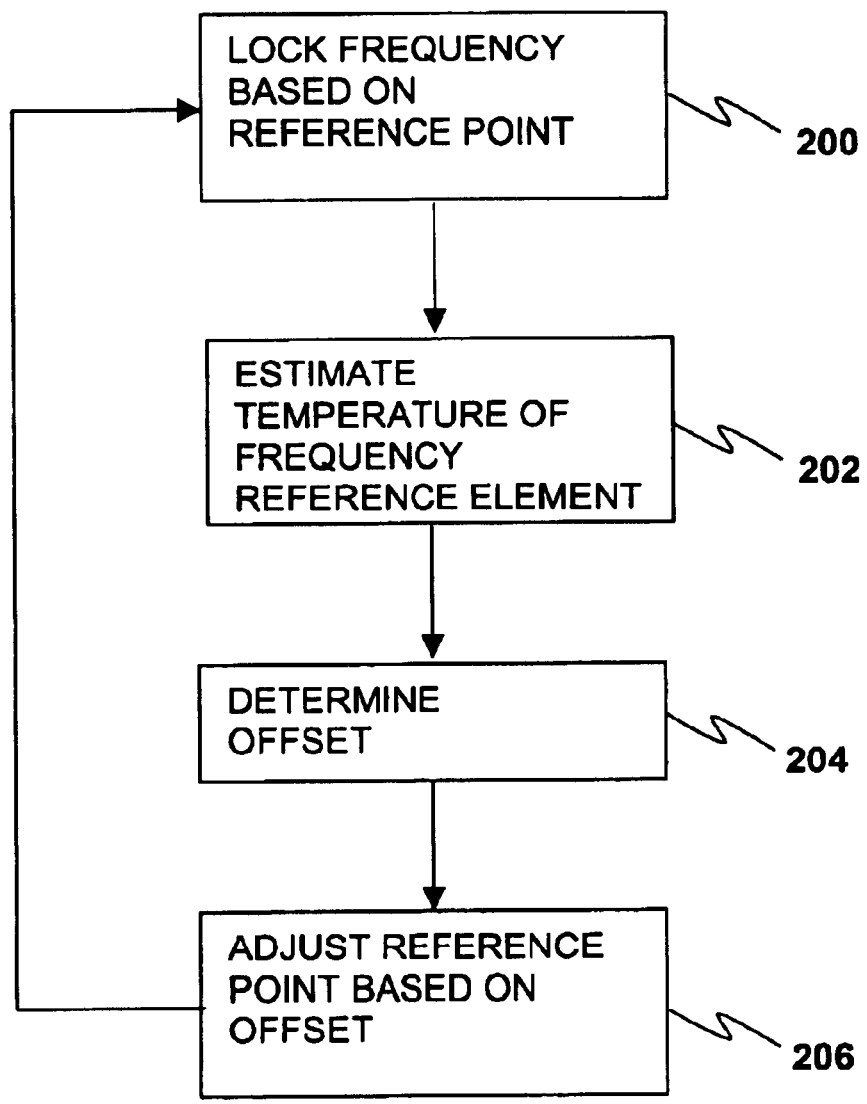
FIG. 10 is a flowchart of an exemplary frequency locking process in an embodiment of the invention.

FIG. 10 is a flowchart illustrating the processing performed by controller 160 in an embodiment of the invention. The process begins at step 200 where the temperature processing module 162 and the temperature driver module 164 operate to lock the output frequency of the optical source 20 based on a reference point.

At step 202, the temperature of the frequency reference element 30 is estimated. As described above, the estimate may be made by the offset processing module 166 based on the TEC current provided by the temperature driver module 164. It is understood that other parameters may be used to estimate the temperature of the frequency reference element 30.

At step 204 an offset is determined by the offset processing module 166 based on the estimate of the temperature of the frequency reference element 30. The offset processing module 166 may compute the offset using a mathematical equation. Alternatively, the offset may be retrieved from a look-up-table indexing offset values based on TEC current.

At step 206, the frequency processing module 162 adjusts the reference point based on the offset. As shown in the example in FIG. 8, the reference point 102 is adjusted by offset 106 to derive a temperature compensated reference point 108. This maintains the output of the optical source 20 at the desired frequency, $\lambda_{REF}$.

Figure 6:
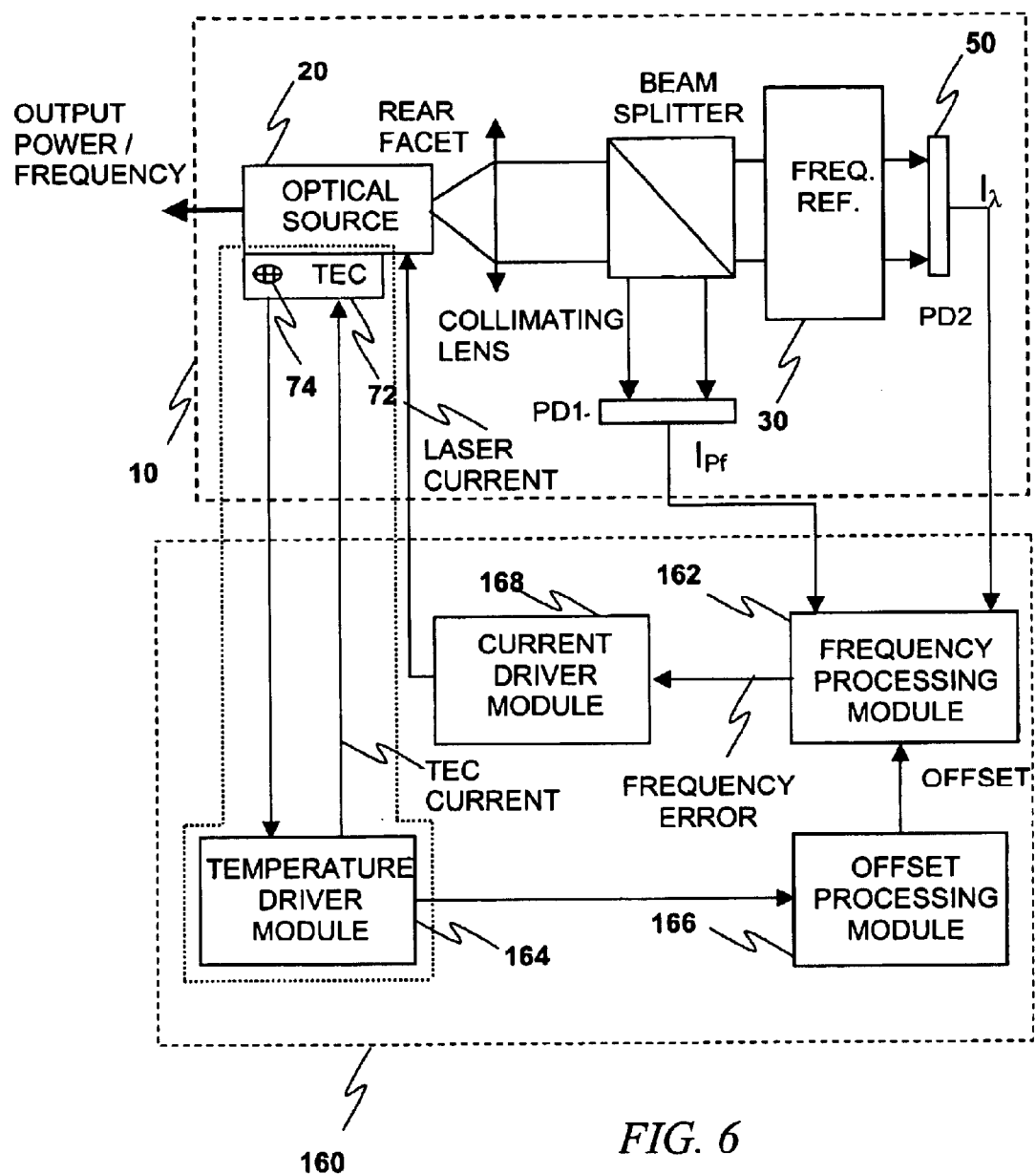
FIG. 6 depicts an optical device and a controller in alternate embodiment.

FIG. 6 depicts an alternate embodiment in which the frequency locking routine uses the current driver module 168 to control the output frequency of the optical source 20. The frequency processing module 162 provides the error signal to the current driver module 168 which adjusts current to the optical source 20 to reduce the frequency error. In this embodiment, the TEC current is still provided from the temperature driver module 164 to the offset processing module 166 to provide an estimate of the temperature of the frequency reference element 30. The offset processing module 166 generates the offset as described above and provides the offset to the frequency processing module 162.

Figure 9:
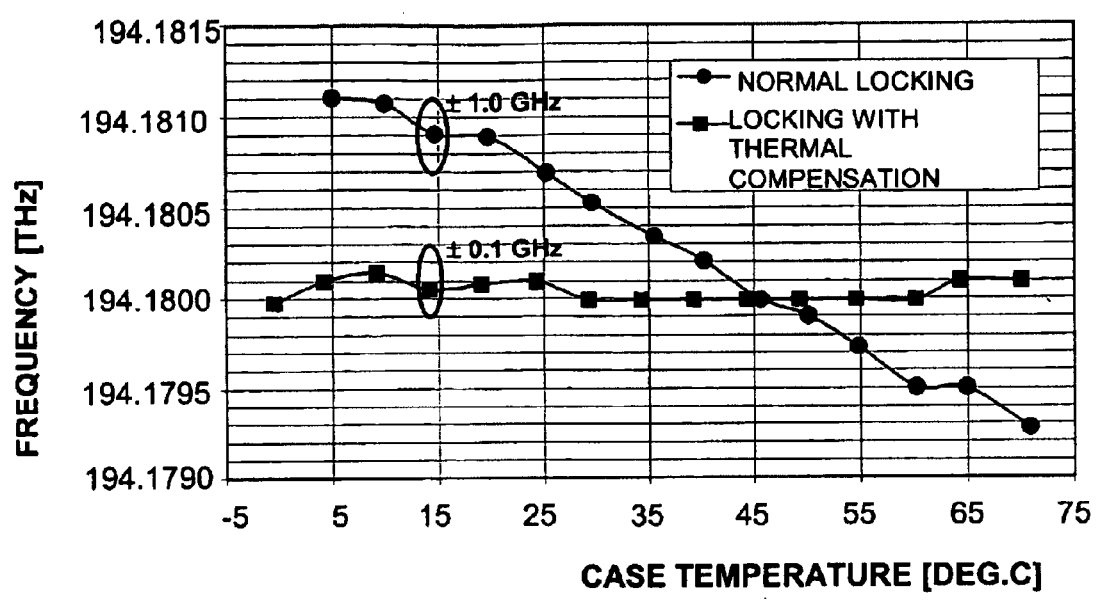
FIG. 9 depicts an illustrative comparison of a locker device, with and without the disclosed temperature compensation of an embodiment of the present invention.

FIG. 9 depicts an illustrative comparison of a locker device, with and without the disclosed temperature compensation offset. As evident, the use of locking with thermal compensation provides more stable output frequency for the optical source 20.

Embodiments of the invention being thus described, it will be obvious that the same may be varied in many ways. Such variations are not to be regarded as departure from the spirit and scope of the invention, and all such modifications as would be obvious to one skilled in the art are intended to be included within the scope of the following claims.

What is claimed is:

1. A controller, coupled to an optical device including an optical source, frequency reference element and a case, the controller comprising:

a frequency processing module, coupled to the optical device, adapted to transmit an error signal based upon a difference between an output frequency of the optical source and a reference frequency;

a driver module, coupled to the optical device and said frequency processing module, adapted to receive the error signal, to transmit a first signal representing a temperature of the frequency reference element and to transmit a second signal to adjust the frequency of the optical source, the temperature of the frequency reference element being estimated based on at least one of a temperature measurement of the optical source and a temperature measurement of the case; and an offset processing module, coupled to said frequency processing module and said driver module, adapted to receive the first signal and to transmit an offset signal based upon the first signal;

wherein said frequency processing module adjusts the error signal, based upon the offset signal, to compensate for the temperature of the frequency reference element.

2. The controller of claim 1 wherein said driver module includes:

a temperature driver module adapted to transmit the second signal to adjust the output frequency of the optical source by adjusting a thermoelectric cooler.

3. The controller of claim 2 where said driver module includes:

a current driver module adapted to transmit the second signal to adjust the output frequency of the optical source by adjusting a current of the optical source.

4. The controller of claim 1 where said driver module includes:

a current driver module adapted to transmit the second signal to adjust the output frequency of the optical source by adjusting a current of the optical source.

5. The controller of claim 1 wherein the temperature of the frequency reference element is estimated based on the temperature measurement of the case of the optical device.

6. The controller of claim 5, wherein the temperature measurement of the case is based on a current of a thermoelectric cooler.

7. The controller of claim 1 wherein the difference between the output frequency of the optical source and the reference frequency is based upon a ratio ($I_\lambda/I_{pf}$) between an output power of the frequency reference element ($I_\lambda$) and an output power ($I_{pf}$) of the optical source.

8. The controller of claim 1 wherein:

said driver module includes:

a temperature driver module adapted to transmit the second signal to adjust the output frequency of the optical source by adjusting a thermoelectric cooler;

a current driver module adapted to transmit the second signal to adjust the output frequency of the optical source by adjusting a current of the optical source; and the difference between the output frequency of the optical source and the reference frequency is based upon a ratio ($I_\lambda/I_{pf}$) between an output power of the frequency reference element ($I_\lambda$) and an output power ($I_{pf}$) of the optical source.

9. The controller of claim 1 wherein the offset processing module generates the offset signal to adjust a reference point to a temperature compensated reference point.

10. The controller of claim 9 wherein the temperature compensated reference point corresponds to a desired ratio ($I_\lambda/I_{pf}$) between an output power of the frequency reference element ($I_\lambda$) and an output power ($I_{pf}$) of the optical source.

11. A method of controlling an optical device including an optical source, a frequency reference element and a case, the method comprising:

generating an offset signal based upon the temperature of the frequency reference element, the temperature of the frequency reference element being estimated based on at least one of a temperature measurement of the optical source and a temperature measurement of the case;

generating an error signal based upon a difference between an output frequency of the optical source and a reference frequency, the reference frequency being adjusted based on the offset signal; and adjusting the optical source based upon the error signal.

12. The method of claim 11 wherein adjusting the optical source includes adjusting a thermoelectric cooler.

13. The method of claim 12 wherein adjusting the optical source includes adjusting a current of the optical source.

14. The method of claim 11 wherein adjusting the optical source includes adjusting a current of the optical source.

15. The method of claim 11 wherein the temperature measurement of the frequency reference element is based on the temperature of the case of the optical device.

16. The method of claim 15 wherein the temperature measurement of the case is based upon at least one variable of a thermoelectric cooler.

17. The method of claim 16 wherein the at least one variable includes a current of the thermoelectric cooler.

18. The method of claim 11 wherein the difference between the output frequency of the optical source and the reference frequency is based upon a ratio ($I_\lambda/I_{pf}$) between an output power of the frequency reference element ($I_\lambda$) and an output power ($I_{pf}$) of the optical source.

19. The method of claim 11 wherein:

adjusting the optical source includes adjusting a thermoelectric cooler;

adjusting the optical source further includes adjusting a current of the optical source; and the difference between the output frequency of the optical source and the reference frequency is based upon a ratio ($I_\lambda/I_{pf}$) between an output power of the frequency reference element ($I_\lambda$) and an output power ($I_{pf}$) of the optical source.

20. The method of claim 11 wherein generating the offset signal includes adjusting a reference point to a temperature compensated reference point.

21. A method of controlling an optical device including an optical source and a frequency reference element, the method comprising:

determining a temperature of the frequency reference element based on at least one of a temperature measurement of the optical source and a temperature measurement of the case; and determining an offset based upon the determined temperature of the frequency reference element;

adjusting a frequency reference point by the offset, the frequency reference point being used to generate an error signal for controlling the optical source.

22. The method of claim 21 wherein determining the temperature in based upon the temperature measurement of the case of the optical device.

23. The method of claim 22 wherein the temperature measurement of the case is based on a current of a thermoelectric cooler.

24. The method of claim 21 wherein the error signal is determined based upon a difference between the frequency reference point and a ratio ($I_\lambda/I_{pf}$) between an output power of the frequency reference element ($I_\lambda$) and an output power ($I_{pf}$) of the optical source.

* * * * *